United States Patent [19]

Tsukada

[11] 4,121,177
[45] Oct. 17, 1978

[54] SEMICONDUCTOR DEVICE AND A METHOD OF FABRICATING THE SAME

[75] Inventor: Toshihisa Tsukada, Sekimachi, Japan

[73] Assignee: Hitachi, Ltd., Japan

[21] Appl. No.: 627,863

[22] Filed: Oct. 31, 1975

Related U.S. Application Data

[63] Continuation-in-part of Ser. No. 474,023, May 28, 1974, abandoned.

[30] Foreign Application Priority Data

| May 28, 1973 | [JP] | Japan | 48-58643 |
| May 28, 1973 | [JP] | Japan | 48-58644 |
| Mar. 4, 1974 | [JP] | Japan | 49-24261 |

[51] Int. Cl.$^2$ .................... H01S 3/19; H01L 21/208
[52] U.S. Cl. ................... 331/94.5 H; 148/171; 331/94.5 C; 357/16; 357/18; 357/55; 357/56
[58] Field of Search ............... 357/16, 18, 55, 56; 331/94.5 H, 94.5 C

[56] References Cited

U.S. PATENT DOCUMENTS

| 3,579,055 | 5/1971 | Ross | 357/18 |
| 3,824,493 | 7/1974 | Hakki | 357/18 |
| 3,833,435 | 9/1974 | Logan et al. | 357/18 |
| 3,849,790 | 11/1974 | Gottsmann et al. | 357/18 |
| 3,883,821 | 5/1975 | Miller | 357/18 |
| 3,893,044 | 7/1975 | Dumke et al. | 357/18 |
| 3,958,263 | 5/1976 | Panish et al. | 357/18 |
| 3,983,510 | 9/1976 | Hayashi et al. | 357/18 |

OTHER PUBLICATIONS

Nakamura et al., Applied Phys. Letters, vol. 22, No. 10, May 15, 1973, pp. 515-516.

Primary Examiner—William D. Larkins
Attorney, Agent, or Firm—Craig & Antonelli

[57] ABSTRACT

A semiconductor device of a filamentary laser is fabricated by a method including the steps of forming a first GaAlAs layer on a GaAs body, forming a laser active layer of GaAs on the first GaAlAs layer, etching the first GaAlAs layer and the laser active layer so as to have a mesa shaped structure and to expose the GaAs body, and forming a second GaAlAs layer on said exposed GaAs body and on the surface of said mesa shaped structure so that the mesa etched first GaAlAs layer and the mesa etched active layer are surrounded by the second GaAlAs layer.

14 Claims, 20 Drawing Figures

SEMICONDUCTOR DEVICE AND A METHOD OF FABRICATING THE SAME

The present invention is a continuation-in-part application of application, Ser. No. 474,023 filed May 28, 1974, now abandoned.

This invention relates to a semiconductor device utilized for an optical device, such as a laser device, a light-emitting diode, a light-waveguide and a band-pass filter, and more particularly to a semiconductor device having a filamentary multi-layered semiconductor crystal including therein at least one heterojunction and a laser active layer adjacent to said heterojunction, and a method for fabricating the semiconductor device.

It is commonly known that the advent of semiconductor devices of double hetero-structure junction lasers has enabled one to reduce remarkably the threshold current density required for lasing and to realize continuous wave operation at room temperature. The term "double hetero-structure" refers to a structure in which a laser active layer in the form of, for example, a layer of p-type GaAs is sandwiched between an n-type GaAlAs layer and a p-type GaAlAs layer to form a pair of heterojunctions therebetween. A structure in which a laser active layer in the form of $Ga_{1-y}Al_yAs$ is sandwiched between layers of $Ga_{1-x}Al_xAs$ ($x>y$) also includes a pair of heterojunctions.

In a semiconductor device such as a laser fabricated from a crystal having such a structure, the electrons and holes injected into the laser active layer during operation cannot advance any further and are confined within the laser active layer since the advancing movement thereof is obstructed by the potential barriers established by the outer layers having a large band gap. Thus, the radiative recombination of the electrons and holes can be effectively attained in such a laser structure. Further, the light produced by the recombination described above is confined within the laser active layer due to the fact that the refractive index of the laser active layer is higher than those of the layers disposed on opposite sides of the laser active layer. Confinement of the carriers and light within the laser active layer leads to a remarkable reduction of the threshold current density required for lasing. Due to the above manner of operation, a double hetero-structure laser can emit a laser beam with a threshold current density which is far lower than those of conventional homojunction lasers and single hetero-structure lasers.

The principles and fundamental structures of the double hetero-structure junction lasers are described in detail in U.S. Pat. No. 3,691,476.

However, a laser structure in which electrodes are merely deposited on opposite faces of a double hetero-structure crystal emits a laser beam which is not satisfactory in its monochromaticity and coherency due to the presence of minute non-uniformity in the crystal structure. In an effort to overcome such a defect, a stripe-geometry laser has been proposed. (J. C. Dyment et. al., J. Appl. Phy., Vol. 40, Page 1802, 1969).

This laser has a structure as described below.

An electrical insulator layer is coated on an epitaxially grown surface of a double hetero-structure crystal; a narrow stripe portion of this insulator layer is removed by etching in a direction perpendicular to the cleavage plane of the crystal; and a metal layer is evaporated on the insulator layer to be in contact with the crystal surface at the narrow stripe portion above described.

With such a structure, current flows in stripe form through the laser active layer during operation of the laser, resulting in a reduction of the laser area. Thus, this laser emits a laser beam of better optical properties than when current flows through the entire laser active layer. On the other hand, an attempt to narrow the width of the stripe electrode in contact with the crystal surface in this laser structure results in an undesirable increase of the threshold current density required for lasing. This is attributable to the fact described below.

The current flowing through the laser active layer in stripe form has a density distribution in the transverse direction such that the current is lowest at portions adjacent to the opposite ends in the transverse direction of the stripe region. Thus, the current in these portions does not contribute to the lasing operation and is ineffective for producing a laser beam because of the low current density. The narrower the width of the stripe electrode, the greater is the degree of divergence of the current out of the laser active layer, and a larger current is required for the laser operation due to the increase of wasted current portions.

For eliminating undesirable losses due to such divergence of current, mesa-stripe geometry lasers have been proposed. (*IEEE Journal of Quantum Electronics,* Vol. QE-9, No. 2, February 1973, "Mesa-Stripe-Geometry Double-Heterostructure Injection Lasers", by T. Tsukada et al).

These lasers have structures wherein a narrow stripe mesa is formed by etching to remove portions of a crystal until the crystal portions are etched to a depth beyond the depth of a laser active layer so that the laser active layer can be included in the narrow stripe mesa (High-Mesa-Stripe), or wherein a narrow stripe mesa is formed by etching to remove portions of layers overlying the laser active and not by etching the laser active layer (Low-Mesa-Stripe). According to these structures, current flows uniformly through the laser active layer without giving rise to undesirable losses as above described and this laser can lase with a very low threshold current density even if the width of the stripe is narrowed; and especially, the Low-Mesa-Stripe laser has shown good optical properties such as a single mode oscillation and a satisfactory polarization of a laser beam.

However, all of the above-mentioned semiconductor devices of the lasers have drawbacks that they have not been fully satisfactory for high quantum efficiency and for affording good optical confinement because side walls are surrounded by an atmosphere of air or by the same material as that of the laser active layer.

For obtaining a satisfactory result in the high quantum efficiency and confinement, it has been proposed that the laser structure wherein a laser active layer, such as GaAs, is bounded on all sides by a material, such as GaAlAs, having a broader band gap and higher refractive index than those of the laser active layer (Japanese laying open patent application 8471 of 1972, (U.S. Pat. No. 3,780,358)). Hereinafter, this structure will be called a buried-heterostructure laser.

This buried-heterostructure laser has a high quantum efficiency, since the laser active layer has a barrier against carriers on all sides, and affords very good optical confinement, since the laser active layer is bounded on all sides by a material having a lower refractive index than that of the laser active layer.

Though it has been considered that the buried-heterostructure laser wherein the laser active layer of GaAs is surrounded by GaAlAs layer would be fabricated by forming a GaAs layer on a GaAlAs body, selectively etching the GaAs layer so as to remain a laser active layer, and forming the GaAlAs layer on the surfaces of said GaAlAs body and of said laser active layer of GaAs, this method has not been accomplished.

It has been found by the inventor during his experiments extending over a long period of time, that GaAlAs or other materials could not be formed or could be formed only partially on a III-V compound semiconductor body including Al in its composition, which is exposed to air. The reason why GaAlAs or other materials could not be or could be partially formed on the body exposed to air is not apparent, but is considered by the inventor that the surface of the body is oxidized and becomes inadequate to secure wetting between a Ga solution to form GaAlAs on other materials, and said body.

It is, therefore, an object of the present invention to provide a novel and improved semiconductor device utilized for an optical device, such as a laser device, a light-emitting diode, a light-waveguide and a band-pass filter, which affords a high quantum efficiency and a good optical confinement.

Another object of the present invention is to provide a semiconductor device whose active region has not a dimensional unbalance between thickness and width and which is adequate as a light source in optical communication.

A further object of the present invention is to provide a semiconductor device of a laser which is capable of continuous wave operation at room temperature.

A still further object of the present invention is to provide a method for fabricating a semiconductor device having a high quantum efficiency and a good optical confinement, and whose active region has not a dimensional unbalance between thickness and width and which is adequate as a light source in optical communication and is capable of continuous operation at room temperature.

In accordance with one aspect of the present invention, there is provided a semiconductor device comprising a semiconductor body consisting of a III-V compound semiconductor material, except a III-V compound semiconductor material including Al in its composition, and having a major surface, a mesa-shaped multi-layered semiconductor crystal including therein a laser active layer and a first semiconductor material being different from and having a broader band gap than that of said laser active layer, which is disposed on a part of the major surface of said semiconductor body, and a second semiconductor material being different from and having a broader band gap than that of said laser active layer, which is disposed on the other part of said major surface of the body and side surfaces of said laser active layer.

In other aspect of the present invention, there is provided a method for fabricating the semiconductor device of the present invention comprising the steps of preparing a semiconductor body consisting of a III-V compound semiconductor material, except a III-V compound semiconductor material including Al in its composition, forming a laser active layer on said semiconductor body, etching said laser active layer so as to have a mesa-shaped structure and to expose the surface of the semiconductor body, and forming a semiconductor layer consisting of a semiconductor material being different from and having a broader band gap than that of said laser active layer on said exposed surface of the semiconductor body, and on the surfaces of said laser active layer.

Other objects, features and advantages of the present invention will be apparent from the following detailed description of some preferred embodiments thereof taken in conjunction with the accompanying drawings wherein like reference numerals are used to denote like parts:

Figure 1:
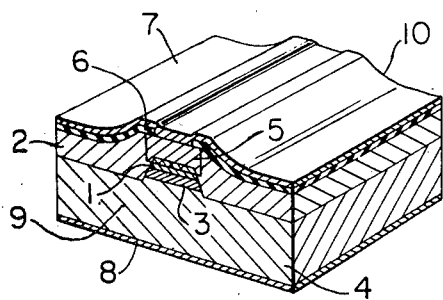
FIG. 1 is a schematic perspective view of one embodiment of the present invention.

Referring to FIG. 1 showing schematically one embodiment of the semiconductor device utilized for a laser device according to the present invention perspective view, on a part of a major surface of an n-type GaAs body 4 whose impurity concentration is about $2 \times 10^{18} cm^{-3}$, a mesa-shaped $2\mu$ wide multi-layered semiconductor crystal consisting of an n-type $Ga_{0.7}Al_{0.3}As$ layer 3 having a thickness of about $1\mu$ directly disposed on the major surface of said GaAs body 4 and a p-type or undoped GaAs layer 1 having a thickness of about $0.5\mu$ disposed on said $Ga_{0.7}Al_{0.3}As$ layer 3, is disposed, and an n-type, undoped or insulated $Ga_{0.7}Al_{0.3}As$ layer 2 is disposed on the surface of the GaAs body 4 and of the mesa-shaped multi-layered semiconductor crystal. A semiconductor region 5 having a p-type conductivity is disposed in the $Ga_{0.7}Al_{0.3}As$ layer 2 so as to reach said GaAs layer 1. An electrical insulating layer 6 which may be a phospho-silicate glass layer is disposed on the surface of the $Ga_{0.7}Al_{0.3}As$ layer 2, except the surface where the semiconductor region 5 is exposed, and metal layer 7 consisting of chromium and gold and metal layer 8 consisting of gold containing germanium and nickel are disposed on said insulating layer 6 so as to provide contact with said semiconductor region 5 and on the other surface opposing to said major surface of said GaAs body 4, respectively. Opposite end faces 9 and 10 are parallel to each other so that a cavity resonator for a laser is formed.

The semiconductor laser having the above structure is fabricated in a manner as will be described below.

Figure 2A:
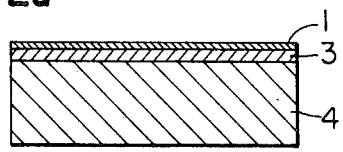
FIGS. 2a through 2b are schematic sectional views showing successive steps for the fabrication of the embodiment shown in FIG. 1.

Referring to FIGS. 2a through 2d showing in schematic vertical sections the structure of a hetero-structure crystal, an n-type $Ga_{0.7}Al_{0.3}As$ layer 3 (wherein the dopant is Sn) of $1\mu$ in thickness and a p-type GaAs layer 1 (wherein the dopant is Ge) of $0.5\mu$ in thickness are successively grown on an n-type GaAs body 4 (wherein the dopant is Te) by a well known liquid phase epitaxial method. (FIG. 2a).

This crystal is maintained at about 450° C. in a chemical vapor deposition apparatus and a layer of an oxide such as $SiO_2$ about 5,000Å thick is coated on the GaAs layer 1 by a chemical vapor deposition method. In lieu of the oxide such as $SiO_2$, phosphosilicate glass may be utilized. The oxide layer is then etched away by a photo resist etching technique except a stripe portion about 5μ wide extending in a direction perpendicular to the (1 1 0) plane of the crystal, thereby exposing the surface of the GaAs body 1. The exposed surface portions of the semiconductor crystal are etched by an etchant which may consist of a 4:1:1 mixture of $H_2SO_4$, $H_2O_2$ and $H_2O$ in volume ratio until these portions are removed to expose at least the surface of the GaAs body 4.

Figure 2B:
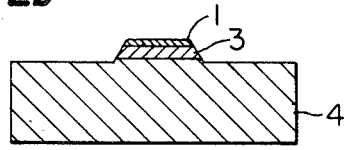

A mesa-shaped multi-layered semiconductor crystal (a stripe mesa) about 2μ wide is thus formed on the surface of the GaAs body 4 by the above steps. The oxide layer covering the surface of the mesa-shaped crystal is removed by an etchant which may be a 6:1 mixture of $NH_4F$ and HF in volume ratio. (FIG. 2b).

Figure 2C:
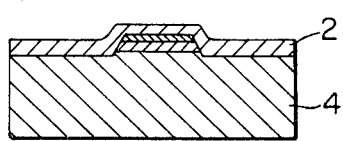

An n-type $Ga_{0.7}Al_{0.3}As$ layer 2 wherein the dopant is Sn is grown on the surface of the GaAs body 4 and of the mesa-shaped crystal by a well known liquid phase epitaxial method. (FIG. 2c)

Figure 2D:
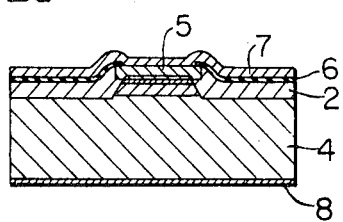
Figure 4D:
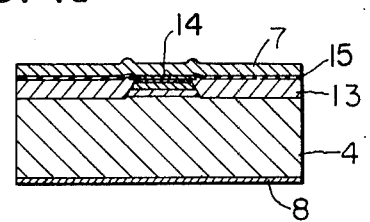

On the surface of the grown n-type $Ga_{0.7}Al_{0.3}As$ layer 2, phospho-silicate glass 6 having a thickness of about 5,000Å is formed by a conventional chemical vapor deposition method, and a part of the phospho-silicate glass 6 corresponding to the mesa-shaped portion is selectively etched by an etchant of $NH_4F$ and HF. A $ZnAs_2$ atmosphere heated at 700° C. is contacted to the surface of said $Ga_{0.7}Al_{0.3}As$ layer 2 exposed in the stripe region, for 5 minutes, whereby a p-type semiconductor region 5 is formed into the $Ga_{0.7}Al_{0.3}As$ layer 2 so as to reach to the GaAs layer 1. Finally gold containing germanium and nickel is evaporated under vacuum on the surfaces of the phosphosilicate glass 6 and the semiconductor region 5, and chromium and gold on the surface of the GaAs body 4 for providing metal layers about 1μ thick as shown in FIG. 2d.

The crystal is then cleaved along the plane perpendicular to the mesa-shaped (filamentary) multi-layered semiconductor crystal, that is, the plane parallel to the (1 1 0) plane so as to obtain a crystal piece which has a longitudinal width of the order of 200μ. These cut faces of the crystal pieces, that is, the end faces 9 and 10 provide the reflecting faces on the Fabry-Perot resonator. This laser device is commonly combined with a heat sink for a lasing operation.

In the above-described method, the side surface of the $Ga_{0.7}Al_{0.3}As$ layer 3 is exposed to air. However, the $Ga_{0.7}Al_{0.3}As$ layer 2 is grown also on the side surface of the $Ga_{0.7}Al_{0.3}As$ layer 3, because of the high density of nucleation centers on the side walls of said layer 3.

The semiconductor laser shown in FIG. 1 and formed by the steps shown in FIGS. 2a through 2d has such advantages that the threshold current density for lasing becomes very low, since the GaAs layer 1 is completely surrounded by the $Ga_{0.7}Al_{0.3}As$ layers 2 and 3 having a broader band gap than that of GaAs, and hence carriers to be recombined with each other are locked within the GaAs layer 1, that is, the laser active layer, and the laser beam is also locked within the GaAs layer 1, since the refractive index of the GaAs layer 1 is higher than that of the $Ga_{0.7}Al_{0.3}As$.

Figure 3:
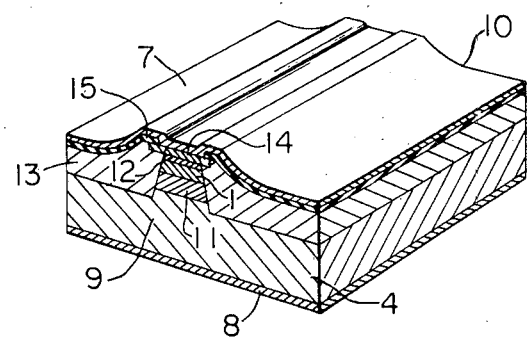
FIG. 3 is a schematic perspective view of another embodiment of the present invention.

Referring to FIG. 3 which is a schematic perspective view of another embodiment of the present invention, on an n-type GaAs body 4, a mesa-shaped multi-layered crystal consisting of an n-type $Ga_{0.6}Al_{0.4}As_{0.98}P_{0.02}$ layer 11 disposed on the body 4, a p-type GaAs layer 1 disposed on said $Ga_{0.6}Al_{0.4}As_{0.98}P_{0.02}$ layer 11, and a p-type $Ga_{0.6}Al_{0.4}As_{0.98}P_{0.02}$ layer 12 disposed on said GaAs layer 1, is disposed, and an n-type or undoped or insulated $Ga_{0.6}Al_{0.4}As_{0.98}P_{0.02}$ or $Ga_{0.4}Al_{0.6}As_{0.97}P_{0.03}$ layer 13 is disposed on the surfaces of the body 4 and of the mesa-shaped multi-layered crystal. A $p^+$-type semiconductor region 14 is disposed within the p-type $Ga_{0.6}Al_{0.4}As_{0.98}P_{0.02}$ layer 12 and the n-type or undoped or insulated $Ga_{0.6}Al_{0.4}As_{0.98}P_{0.02}$ or $Ga_{0.4}Al_{0.6}As_{0.97}P_{0.03}$ layer 13 as shown in FIG. 3. A $SiO_2$ layer 15 is disposed on the layer 13 except a part of the semiconductor region 14, and metal layers 7 and 8 are disposed on the $SiO_2$ layer 15 so as to contact with the semiconductor region 14 and on the surface of the body 4, respectively.

This laser device is fabricated by the steps as follows.

Figure 4A:
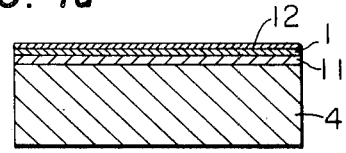
FIGS. 4a through 4d are schematic sectional views showing successive steps for the fabrication of said another embodiment shown in FIG. 3.
Figure 4B:
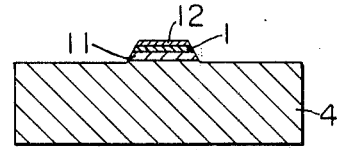
Figure 4C:
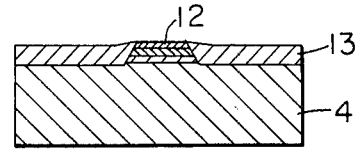

An n-type $Ga_{0.6}Al_{0.4}As_{0.98}P_{0.02}$ layer 11, an undoped GaAs layer 1 and a p-type $Ga_{0.6}Al_{0.4}As_{0.98}P_{0.02}$ layer 12 are formed successively on an n-type GaAs body 4 by a conventional liquid phase epitaxy method. (FIG. 4a) The layers 11, 1 and 12 are selectively etched so as to have a mesa-shaped crystal structure and to expose the surface of the GaAs body 4. (FIG. 4b) An n-type layer 13 is then formed on the surfaces of the body 4 and of the mesa-shaped crystal. According to this step, the layer 13 is not formed on the layer 12, since on III-V semiconductor compounds including Al in its composition, it is very hard to form crystals. (FIG. 4c). A $SiO_2$ layer 15 is formed on the surfaces of the n-type layer 13 and of the p-type layer 12, and is selectively etched so as to expose at least a part of the surface of said p-type layer 12. Zn is diffused into the $Ga_{0.6}Al_{0.4}As_{0.98}P_{0.02}$ layer through the exposed surface, thereby forming a p-type semiconductor region 14. Conductive layers 7 and 8 are formed on the $SiO_2$ layer 15 and the p-type semiconductor region 14, and the surface of the GaAs body 4, respectively.

This device has the following advantages, as compared with the device shown in FIG. 1. In the device shown in FIG. 1, a diffusion front of the semiconductor region 5, which tends to increase defects in the region 1, reaches the laser active layer 1, and hence the threshold current density becomes high and the deterioration of the device occurs rapidly; on the other hand, in the device shown in FIG. 3, since the diffusion front does not reach the laser active layer 1, the threshold current density does not become high and a deterioration of the device hardly occurs. And also, in fabrication of the device shown in FIG. 3, there is an advantage that the control of the time period and the temperature in forming the semiconductor region 14 becomes easy compared with the control in fabricating the device shown in FIG. 1, since the diffusion front may be stopped either in the $Ga_{0.6}Al_{0.4}As_{0.98}P_{0.02}$ layer 12 or in the GaAs layer 1. When the diffusion front is stopped in the $Ga_{0.6}Al_{0.4}As_{0.98}P_{0.02}$ layer 12 as in the device shown in FIG. 3, advantages such as in the device shown in FIG. 3 described before can be obtained.

FIGS. 5 through 9 are schematic sectional views of further embodiments of the present invention.

Figure 5:
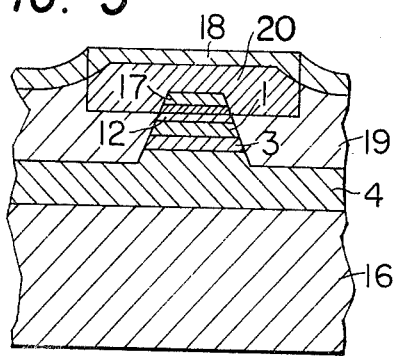
FIGS. 5 through 9 are schematic sectional views of further embodiments of the present invention.

An embodiment shown in FIG. 5 comprises an n-type GaAs body 4 disposed on an n-type GaAs substrate 16, a mesa-shaped multi-layered crystal consisting of an n-type GaAlAs layer 3, a p-type GaAs layer 1, a p-type GaAlAs layer 12 and a p-type GaAs layer 17 disposed, successively, on a part of the surface of the n-type GaAs body 4, an undoped GaAlAs layer 19 disposed on the surfaces of the n-type GaAs body 4 and of the mesa-shaped multi-layered crystal, a p-type GaAs layer 18 disposed on the surface of the undoped GaAlAs layer 19, and a semiconductor region of a p-type conductivity disposed in a part of the GaAs layer 18, a part of the GaAlAs layer 19, the GaAs layer 17, and a part of the GaAlAs layer 12. Electrodes are disposed so as to contact the semiconductor region 20 and the GaAs substrate 16.

The fabrication of this device is fundamentally the same as that of the device shown in FIG. 1. That is, the fabrications of the mesa-shaped multi-layered crystal and the GaAlAs layer 19 are the same except the mesa-shaped multi-layered crystal in FIG. 5, consisting of four layers 3, 1, 12 and 17, and it is different from the fabrication of the device shown in FIG. 1 in that, in the fabrication of the device shown in FIG. 5, only the n-type GaAs substrate 16 is prepared and the GaAs layer 18 is formed. The n-type GaAs substrate 16 is utilized for strengthening the GaAs body 4, and the GaAs layer 18 is utilized for easily forming an ohmic contact with the electrode to be disposed thereon.

In the fabrication of the device shown in FIG. 5, since the layers 1, 12 and 17 are of p-type conductivity, the diffusion front of the semiconductor region 20 may be stopped in either one of said layers 1, 12, and 17, and hence the fabrication becomes easy.

Figure 6:
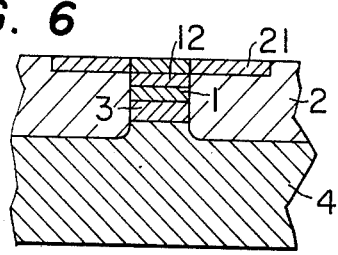

FIG. 6 shows a sectional view of another embodiment of the present invention, which comprises a mesa-shaped multi-layered crystal consisting of an n-type GaAlAs layer 3, a p-type GaAs layer 1 and a p-type GaAlAs layer 12, disposed on an n-type GaAs body 4, an n-type GaAlAs layer 2 disposed on the surface of the GaAs body 4 and on the side surfaces of the meas-shaped multi-layered crystal, and a p-type semiconductor region 21 disposed in the n-type GaAlAs layer 2 and in the p-type GaAlAs layer 12.

Attention should be directed that after forming the mesa-shaped multi-layered crystal, the GaAlAs layer 2 cannot be formed on the GaAlAs layer 12, but on the surface of the GaAs body 4 and the side surfaces of the mesa-shaped multi-layered crystal.

Figure 7:
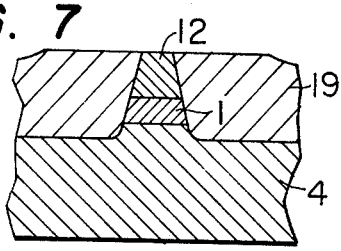

FIG. 7 shows a sectional view of another embodiment of the present invention, which comprises a n-type GaAs body 4, a mesa-shaped multi-layered crystal consisting of a p-type GaAs layer 1 and a p-type $Ga_{0.7}Al_{0.3}As$ layer 12, disposed on the part of the surface of the body 4, and an undoped $Ga_{0.7}Al_{0.3}As$ layer 19 disposed on the surface of the body 4 and the side surface of the mesa-shaped multi-layered crystal.

Figure 8:
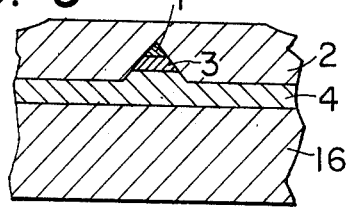
Figure 9:
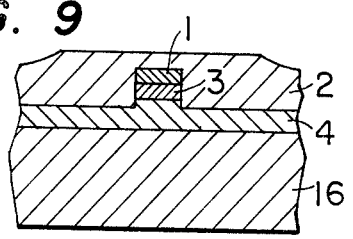

FIGS. 8 and 9 show sectional views of still another embodiment of the present invention which are utilized for a light-waveguide.

An embodiment of the present invention shown in FIG. 8 comprises an n-type GaAs substrate 16, an n-type GaAs body 4, a mesa-shaped multi-layered crystal being a triangular shape in cross-section consisting of an n-type GaAlAs layer 3 and a p-type GaAs layer 1, and an n-type GaAlAs layer 2. Since the GaAs layer 1 is completely surrounded by the GaAlAs layers 2 and 3 whose refractive index is lower than that of the GaAs layer 1, light is locked in the GaAs layer 1, and hence the GaAs layer 1 is utilized for a light-waveguide.

Another embodiment of the present invention shown in FIG. 9 is almost the same as that shown in FIG. 8.

The difference between the embodiments shown in FIGS. 8 and 9 is that the device shown in FIG. 8 has a mesa-shaped multi-layered crystal being a triangular shape in cross-section, and, on the other hand, the device shown in FIG. 9 has a mesa-shaped multi-layered crystal being a rectangular shape in cross-section.

In the above-mentioned semiconductor devices, when the device are utilized for the laser, they must have a cavity resonator which usually comprises parallel planes disposed on the end surfaces of the laser active layer 1 so as to be perpendicular to the laser beam to be emitted from the laser active layer 1.

Figure 10A:
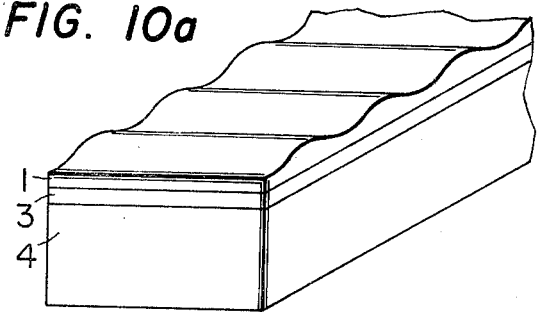
FIGS. 10a through 10c are schematic views of a still further embodiment of the present invention showing successive steps for the fabrication of said still further embodiment.
Figure 10B:
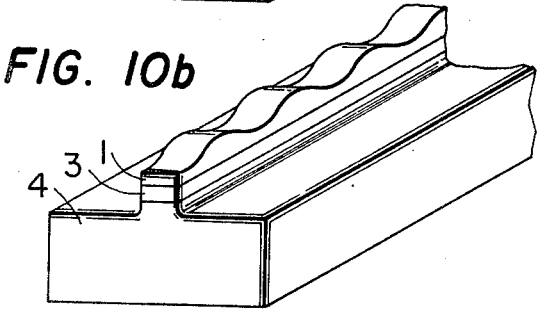
Figure 10C:
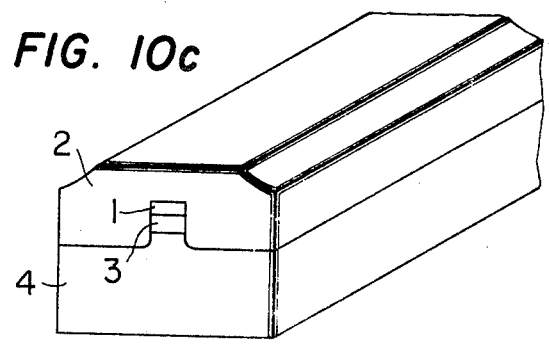

A still further embodiment of the present invention which does not necessitate the cavity resonator is shown in FIGS. 10a to 10c.

This device comprises an n-type GaAs body 4, a mesa-shaped multi-layered crystal consisting of an n-type GaAlAs layer 3 and a p-type GaAs layer 1 having a periodically corrugated surface, disposed on a part of the surface of the body 4, and an n-type GaAlAs layer disposed on the surfaces of the body 4 and the mesa-shaped multi-layered crystal.

Fabrication of this device will be explained according to FIGS. 10a through 10c.

On an n-type GaAs body 4, an n-type GaAlAs layer 3 and a p-type GaAs 1 are formed successively. Then a photo-resist layer is formed on the p-type GaAs 1, and ultra-violet light is directed onto said photo-resist layer so that interference fringes are formed on the surface of said photo-resist layer. When the photo-resist layer is developed, a photo-resist having a periodically corrugated surface is obtained. After this, the resultant crystal is introduced into an ion milling machine and is etched by ions, thereby forming a resultant crystal shown in FIG. 10a having a periodically corrugated surface on the GaAs layer 1. This resultant crystal is mesa-etched as shown in FIG. 10b. At this stage, the surface of the GaAs body 4 must be exposed. An n-type GaAlAs layer 2 is formed on the surfaces of the GaAs body 4 and of the mesa-shaped multi-layered crystal. (FIG. 10c)

This device acts as a laser device when an electric field is applied to the GaAs layer 1, and a laser wavelength λ of the laser device becomes $$\lambda = 2Sn/m,$$

wherein S is a period of the corrugation formed on the surface of the GaAs layer 1, n is a refractive index of the GaAs layer 1, and m is an integer.

This device also acts as a light-waveguide having a filtering function, in other words, a band-pass filtering function. That is, only a light whose frequency is coincident with said λ passes through the device. The band width of the device is very narrow, and hence this device may be utilized for separating modes of the laser beam.

Figure 11:
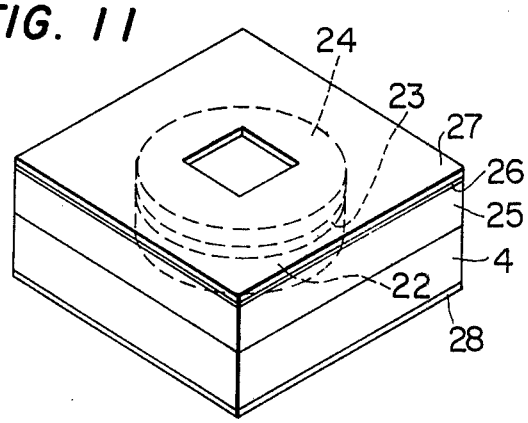
FIG. 11 is a schematic perspective view showing a still further embodiment of the present invention.

FIG. 11 is a schematic perspective view for explaining a still further embodiment of the present invention.

This semiconductor device is utilized for a light-emitting diode, and comprises an n-type GaAs body 4, a circular mesa-shaped multi-layered crystal consisting of an n-type $Ga_{0.5}Al_{0.5}As$ layer 22, an n-type $Ga_{0.7}Al_{0.3}As$ layer 23 which is a light-emitting portion, and a p-type $Ga_{0.5}Al_{0.5}As$ layer 24 disposed on a part of the surface of the body 4, an n-type $Ga_{0.5}Al_{0.5}As$ layer 25 disposed on the surface of the body 4 and on the side surface of the crystal, an insulating layer 26 such as $SiO_2$ disposed on the surfaces of the crystal and of the layer 25, which has a through hole at a portion corresponding to a part of the surface of the crystal, and electrodes 27 and 28 disposed on the insulating layer 26 and the exposed surface of the crystal through the through hole and on the body 4, respectively.

This light-emitting diode emits a light having a wavelength of about 7,000A with a high conversion efficiency.

In the above embodiment, though the crystal has the circular-shaped mesa structure, any shapes of the crystal, such as numbers and letters, may be utilized.

While the invention has been explained in detail, it is to be understood that the technical scope of the invention is not limited to that of the foregoing embodiments. For example, though embodiments shown in FIGS. 1, 3, 5, 6, 7 and 10 are explained for the laser devices, these are utilized as light-waveguides when no electric fields are applied to the mesa-shaped multi-layered crystal, and as light-emitting diodes when no cavity resonators are applied to the laser active layer, and other embodiments shown in FIGS. 8 and 9 may be utilized as the laser device or as the light-emitting diode.

Further, in the embodiments, though GaAs is mainly utilized as the laser material, other materials capable of lasing function may be utilized for the laser active material; and also, though semiconductor materials including Al in its composition are utilized for materials surrounding the laser active layer, other materials having broader band gaps than those of the laser active materials, such as $Ga_{1-x}Al_xAs$ ($0 < x \leq 1$) and $Ga_{1-x}Al_xAs_{1-y}P_y$ ($0 < x, y \leq 1$), may be utilized.

According to the semiconductor laser of the present invention, a laser beam which has only a lowest-order transverse mode, i.e. $TE_{00}$ mode can be obtained with a high reproducibility, when the laser active layer has certain conditions.

It has been recognized in the art that the laser beam having higher order modes, such as $TE_{01}$, $TE_{02}$, etc. therein are not desirable when the laser beam is coupled with other optical components such as an optical fiber, or when the laser is used as a light source in reconstructing a holographic image, and hence the laser which emits the laser beam having only the lowest-order transverse mode $TE_{00}$ has been desired. The semiconductor laser of the present invention can satisfy such desire, and hence is very useful.

The conditions are $A < 1$ $\mu m^2$ and $\frac{1}{2}(a + b) < 1$ $\mu m$, wherein A is an area of a section, of the laser active layer, being perpendicular to a direction in which a light generated in the active layer is propagated therein and $a$ and $b$ are lengths of sides, of the cross section of the active layer, one of which is facing toward a surface of the body of the semiconductor laser and the other of which is far from the surface of the body.

These conditions are based on the results of the present inventor's experiments.

Figure 12:
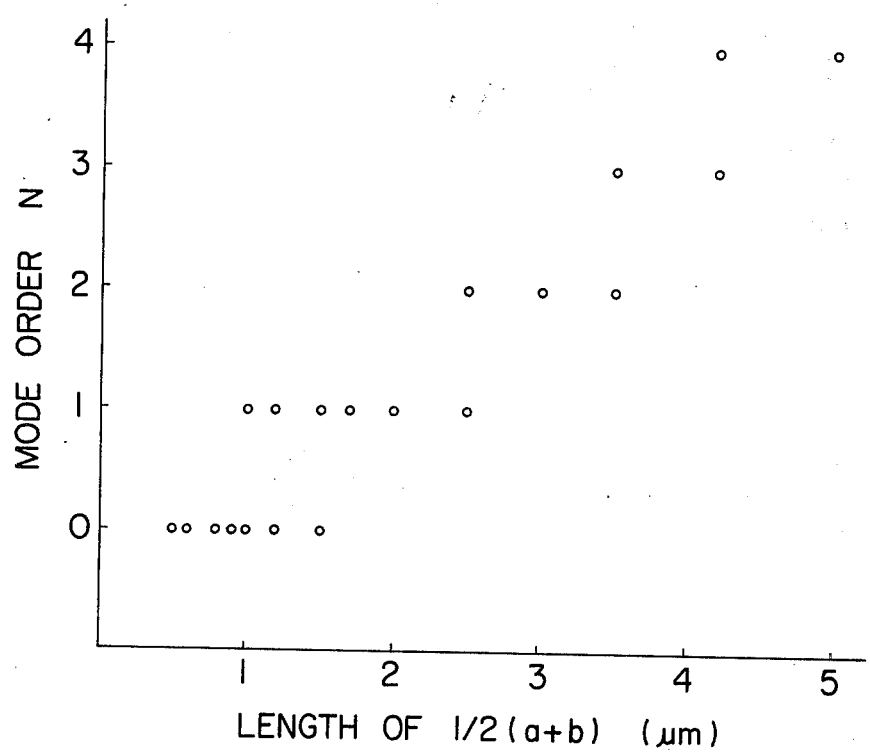
FIG. 12 is a graph showing a relation between a mode order and a width of a laser active layer.

When the mode is designated as $TE_{MN}$, $M = 0$ is obtained when the distance between said two sides of the active layer is not larger than 1 $\mu m$, preferably 0.8 $\mu m$, snce the probability of the generation of the mode wherein $M = 1$, i.e. $TE_{1N}$, becomes very low, and $N = 0$ is obtained when the lengths of sides $a$ and $b$ are in the relation of $\frac{1}{2}(a + b) < 1$ $\mu m$, which will be apparent from FIG. 12 wherein the relation between the mode order N and the length of $\frac{1}{2}(a + b)$ ($\mu m$), which is one of the results of the present inventor's experiments, is shown. As is apparent from FIG. 12, the laser beam having the mode wherein $N = 0$ is obtained when the length of $\frac{1}{2}(a + b)$ is less than 1 $\mu m$. When the length of $\frac{1}{2}(a + b)$ is 1 $\mu m$, though the laser beam having the mode wherein $N = 0$ is often obtained, the laser beam having the mode wherein $N = 1$ is sometimes obtained solely or with the laser beam having the mode wherein $N = 0$. Therefore, the reproducibility is rather low.

On the other hand, when the length of $\frac{1}{2}(a + b)$ is 0.9 $\mu m$, only the laser beam having the mode wherein $N = 0$ is obtained, and hence the reproducibility to obtain the laser beam having the mode $N = 0$ becomes very high.

According to the inventor's experiments, therefore, it is preferable for obtaining a laser beam having a mode of $M = 0$ and $N = 0$, i.e. $TE_{00}$ to make the active layer so that the area A of the section is less than 1 $\mu m^2$ and the length of $\frac{1}{2}(a + b)$ is less than 1 $\mu m$.

A preferable range of the length of $\frac{1}{2}(a + b)$ is from 0.3 $\mu m$ inclusive to 1 $\mu m$ exclusive, and more preferably from 0.5 $\mu m$ inclusive to 1 $\mu m$ exclusive, since it becomes easy to fabricate when the length of $\frac{1}{2}(a + b)$ becomes long.

While various embodiments of the present invention and modifications thereof have been described in detail by way of example, it is apparent to those skilled in the art that many changes and modifications may be made therein without departing from the spirit and scope of the appended claims.

What is claimed is:

1. A semiconductor device comprising:
   a semiconductor body consisting of a III-V compound semiconductor material not including Al, having a major surface, and having a first conductivity type;
   a mesa-shaped multi-layered semiconductor crystal disposed upon a portion of the major surface of said body and including
   (i) a laser active layer having two opposite surfaces, a first surface of which faces towards the major surface of said body and a second surface of which faces away from the major surface of said body, a pair of said surfaces and a pair of end surfaces,
   (ii) an upper semiconductor layer of a second conductivity type, opposite to said first conductivity type, being a top layer of said mesa-shaped multi-layered semiconductor crystal, consisting of a material including Al and having a broader band gap than that of the material of said laser active layer, and disposed on the second surface of said laser active layer, and
   (iii) a lower semiconductor layer of said first conductivity type, consisting of a material different from and having a broader band gap than that of the material of said laser active layer, and disposed on the first surface of said laser active layer;
   a side semiconductor layer of said first conductivity type consisting of a material different from and having a broader band gap than that of the material of said laser active layer, and disposed on the remainder of said major surface of said body and contiguous with the laser active layer at the side surfaces thereof but not the top surface of said mesa-shaped multi-layered semiconductor crystal; and
   first and second layers disposed on said semiconductor body and said upper semiconductor layer, respectively.

2. A semiconductor device according to claim 1, wherein the materials of said laser active layer and said body are $Ga_{1-y}Al_yAs$ ($0 \leq y < 1$) and GaAs, respectively, and the materials of said upper, lower, and side semiconductor layers are selected from the group consisting of $Ga_{1-x}Al_xAs$ ($0 < x \leq 1$, $x > y$) and $Ga_{1-x}Al_xAs_{1-q}P_q$ ($0 < x \leq 1$, $0 \leq q 1$, and $x > y$).

3. A semiconductor device according to claim 2, wherein the materials of said upper, lower, and side semiconductor layers are GaAlAs.

4. A semiconductor device according to claim 2, wherein said materials of said upper, side, and lower semiconductor layers are $Ga_{1-x}Al_xAs$ ($0 < x \leq 1$), $Ga_{1-z}Al_zAs$ ($x \leq z \leq 1$), and $Ga_{1-x}Al_xAs$ ($0 < x \leq 1$), respectively.

5. A semiconductor device according to claim 1, wherein the distance between said first and second surfaces is less than 1 μm.

6. A semiconductor device according to claim 1, wherein said end surfaces are parallel to each other so as to form a cavity resonator.

7. A semiconductor device according to claim 1, wherein said laser active layer has said second conductivity type.

8. A semiconductor device according to claim 1, wherein the thickness of said side semiconductor layer exceeds the thickness of said upper semiconductor layer by the sum of the thicknesses of said laser active layer and said lower semiconductor layer.

9. A semiconductor device according to claim 1, wherein the area A of a section of said laser active layer, perpendicular to the direction in which light generated in said laser active layer is propagated therein, is less than 1 μm².

10. A semiconductor device according to claim 1, further comprising a semiconductor region of a second conductivity type, having a higher impurity concentration than that of said upper semiconductor layer, formed in the surface region of said upper semiconductor layer, and wherein said second metal layer is in contact with said semiconductor region.

11. A semiconductor device comprising:
a semiconductor body consisting of a III-V compound semiconductor material not including Al, having a major surface, and having a first conductivity type;
a mesa-shaped multi-layered semiconductor crystal disposed upon a first portion of the major surface of said body and including
(i) a laser active layer having two opposite surfaces, a first surface of which faces towards the major surface of said body and a second surface of which faces away from the major surface of said body, a pair of side surfaces and a pair of end surfaces,
(ii) an upper semiconductor layer of a second conductivity type, opposite to said first conductivity type, being a top layer of said mesa-shaped multi-layered semiconductor crystal, consisting of a material including Al and having a broader band gap than that of the material of said laser active layer, and disposed on the second surface of said laser active layer, and
(iii) a lower semiconductor layer of said first conductivity type, consisting of a material including Al, different from and having a broader band gap than that of the material of said laser active layer, and disposed on the first surface of said laser active layer;
a side semiconductor layer of said first conductivity type consisting of a material including Al, different from and having a broader band gap than that of the material of said laser active layer and having a mole fraction of Al greater than the mole fraction of Al in the material of said upper and lower semiconductor layers, and disposed on the remaining portion of said major surface of said body and contiguous with the laser active layer at the side surfaces thereof but not the top surface of said mesa-shaped multi-layered semiconductor crystal; and
first and second metal layers disposed on said semiconductor body and said upper semiconductor layer, respectively.

12. A semiconductor device according to claim 11, wherein the thickness of said side semiconductor layer exceeds the thickness of said upper semiconductor layer by the sum of the thicknesses of said laser active layer and said lower semiconductor layer.

13. A semiconductor device according to claim 11, wherein the area A of a section of said laser active layer, perpendicular to the direction in which light generated in said laser active layer is propagated therein, is less than 1 μm².

14. A semiconductor device according to claim 11, further comprising a semiconductor region of a second conductivity type, having a higher impurity concentration than that of said upper semiconductor layer, formed in the surface region of said upper semiconductor layer, and wherein said second metal layer is in contact with said semiconductor region.

* * * * *